United States Patent
Farquhar et al.

(10) Patent No.: US 6,552,263 B2
(45) Date of Patent: Apr. 22, 2003

(54) METHOD OF INJECTION MOLDED FLIP CHIP ENCAPSULATION

(75) Inventors: Donald Seton Farquhar, Endicott, NY (US); Kostantinos Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/150,125

(22) Filed: May 16, 2002

(65) Prior Publication Data

US 2002/0134569 A1 Sep. 26, 2002

Related U.S. Application Data

(62) Division of application No. 08/884,228, filed on Jun. 27, 1997, now Pat. No. 6,407,461.

(51) Int. Cl.⁷ .............................. H01L 23/28; H05K 5/06
(52) U.S. Cl. ...................... 174/52.2; 174/52.4; 257/788; 257/738; 29/841; 438/127
(58) Field of Search ................................. 257/787, 788, 257/738, 667; 174/52.2, 52.4; 29/841; 438/127

(56) References Cited

U.S. PATENT DOCUMENTS

| | | | |
|---|---|---|---|
| 4,915,607 A | 4/1990 | Medders et al. | |
| 4,942,140 A | 7/1990 | Ootsuki et al. | |
| 5,019,673 A | 5/1991 | Juskey et al. | |
| 5,120,678 A | 6/1992 | Moore et al. | |
| 5,169,056 A | 12/1992 | Recle et al. | |
| 5,203,076 A | 4/1993 | Banerji et al. | |
| 5,239,198 A | 8/1993 | Lin et al. | |
| 5,248,710 A | 9/1993 | Shiobara et al. | |
| 5,273,938 A | 12/1993 | Lin et al. | |
| 5,292,688 A | 3/1994 | Hsiao et al. | |
| 5,371,404 A | 12/1994 | Juskey et al. | |
| 5,385,869 A | 1/1995 | Liu et al. ........................ 29/841 |
| 5,450,283 A | 9/1995 | Lin et al. | |
| 5,561,329 A | 10/1996 | Mine et al. ................... 257/788 |
| 5,697,148 A | 12/1997 | Lance et al. | |
| 5,700,723 A | 12/1997 | Barber | |
| 5,924,190 A | * 7/1999 | Lee et al. ........................ 29/827 |

FOREIGN PATENT DOCUMENTS

| | | |
|---|---|---|
| EP | 0 528 171 A2 | 2/1993 |
| EP | 0 690 499 A2 | 1/1996 |
| EP | 0 775 716 A1 | 5/1997 |
| JP | 63174327 A | 7/1988 |
| JP | 06252190 A | 9/1994 |
| RU | 2025191 C1 | 12/1994 |
| RU | 2035485 C1 | 5/1995 |
| RU | 2041532 C1 | 8/1995 |
| RU | 2043384 C1 | 9/1995 |
| RU | 2046425 C1 | 10/1995 |
| RU | 1609431 A1 | 1/1996 |
| RU | 2064956 C1 | 8/1996 |
| RU | 2091222 C1 | 9/1997 |
| WO | 92/13694 | 8/1992 |
| WO | 96/42106 | 12/1996 |
| WO | 97/27624 | 7/1997 |

OTHER PUBLICATIONS

Translation of Patent Office Action is counterpart Russian Application 2000 100 826 issued May 27, 2002.

(List continued on next page.)

*Primary Examiner*—Hung V. Ngo
(74) *Attorney, Agent, or Firm*—William N. Hogg

(57) ABSTRACT

The electrical interconnections between an integrated circuit chip assembly are encapsulated and reinforced with a high viscosity encapsulant material in a single step molding process wherein a mold is placed over an integrated circuit chip assembly and encapsulant material is dispensed through an opening in the mold and forced around and under the integrated circuit chip by external pressure encapsulating the integrated circuit chip assembly. An integrated circuit chip assembly having a reinforced electrical connection which is more resistant to weakening as a result is stress created by differences in coefficient of thermal expansion between the integrated circuit chip and the substrate to which the integrated circuit chip is attached is produced.

14 Claims, 1 Drawing Sheet

OTHER PUBLICATIONS

Title page of Russian publication and page 172 cited in action of May 27, 2002 re Russian S/N 2000 100 826.

Translation of Patent Office Action in counterpart Russian Application 2000 100 826 issued Oct. 23, 2001.

"XP–002075500 Study on the Pressurized Underfill Encapsulation of Flip Chips"; Sejin Han and K. K. Wang; IEEE Transactions on Components, Packaging, and Manufacturing Technology –Part B. Vol. 20, No. 4. Nov. 1997 Pages 434–442.

* cited by examiner

METHOD OF INJECTION MOLDED FLIP CHIP ENCAPSULATION

CROSS REFERENCE TO RELATED APPLICATION

This application is a divisional of application Ser. No. 08/884,228, filed Jun. 27, 1997 now U.S. Pat. No. 6,407,461.

BACKGROUND OF THE INVENTION

This invention relates to an improved method for encapsulating and reinforcing the electrical interconnections between an integrated circuit chip and a substrate. It also relates to an integrated circuit chip assembly produced by said method.

An integrated circuit chip assembly generally comprises an integrated circuit chip attached to a substrate, typically a chip carrier or a circuit board. The most commonly used integrated circuit chip is composed primarily of silicon having a coefficient of thermal expansion of about 2 to 4 ppm/° C. The chip carrier or circuit board is typically composed of either a ceramic material having a coefficient of thermal expansion of about 6 ppm/° C., or an organic material, possibly reinforced with organic or inorganic particles or fibers, and having a coefficient of thermal expansion in the range of about 6 to 50 ppm/° C. One technique well known in the art for attaching the chip to the substrate is flip chip bonding. In flip chip bonding, a pattern of solder balls, usually having a diameter of about 0.002 to 0.006 inches, is formed on one surface of the integrated circuit chip, fully or partially populating the active chip surface with interconnection sites. A matching footprint of solder wettable terminals is provided on the substrate. The integrated circuit chip is then placed in alignment with the substrate, and the chip to substrate connections are formed by reflowing the solder balls. During operation of an integrated circuit chip assembly, cyclic temperature excursions cause the substrate and the integrated circuit chip to expand and contract. Since the substrate and the integrated circuit chip have different coefficients of thermal expansion, they expand and contract at different rates causing the solder ball connections to weaken or even crack as a result of fatigue. To remedy this situation, it is common industry practice to reinforce the solder ball connections with a thermally curable polymer material known in the art as an underfill encapsulant.

Underfill encapsulants are typically filled with ceramic particles to control their rheology in the uncured state, and to improve their thermal and mechanical properties in the cured state. Underfill encapsulants have been used widely to improve the fatigue life of integrated circuit chip assemblies consisting of an integrated circuit chip of the flip chip variety attached to a substrate comprised of an alumina ceramic material having a coefficient of thermal expansion of about 6 ppm/° C. More recently, integrated circuit chip assemblies have been manufactured using substrates comprised of a reinforced organic material having a composite coefficient of thermal expansion of about 20 ppm/° C.

The underfill encapsulation process is typically accomplished by dispensing a liquid encapsulant directly onto the substrate at one or more points along the periphery of the integrated circuit chip. The encapsulant is drawn into the space between the integrated circuit chip and the substrate by capillary forces, and forms a fillet around the perimeter of the integrated circuit chip. The diameter of the filler particles in the encapsulant is typically smaller than the height of the space so that flow is not restricted, with typical encapsulants having viscosities of about 10 Pa-s at the dispense temperature. Once the underfilling process is completed, the encapsulant is heat cured in an oven. Cured encapsulants typically have coefficients of thermal expansion in the range of 20 to 40 ppm/° C. and a Young's Modulus of about 1 to 3 Gpa, depending on the filler content and the type of chemistry. Depending on the materials the integrated circuit chip and the substrate are composed of, it may be desirable to further alter the cured properties of the encapsulant. However, the requirement that the encapsulant have low viscosity in the uncured state so that it flows readily into the space between the integrated circuit chip and the substrate severely restricts the formulation options. For example, the addition of more ceramic filler would result in a lower coefficient of thermal expansion, but would cause an increase in the viscosity of the uncured encapsulant. Furthermore, even with the use of underfill encapsulation, fatigue life of an integrated circuit chip assembly is shorter when the integrated circuit chip is interconnected to an organic substrate as opposed to a ceramic substrate due to the greater mismatch in thermal expansion between the typical integrated circuit chip and organic substrates.

Also known in the art is a method wherein a package body is formed around the perimeter of the flip chip using a two step process. First the integrated circuit chip assembly is underfilled as described above. Next, a package body is formed around the perimeter of the integrated circuit chip using a molding process.

The prior art also suggests a process wherein additional reinforcement is achieved by forming a package body around the integrated circuit chip assembly using a single step operation. In this process, a large opening of about 50% of the size of the integrated circuit chip is formed in the substrate under the integrated circuit chip. This approach essentially eliminates the space between the integrated circuit chip and the substrate that is typical of a conventional integrated circuit chip to substrate interconnection, but has the drawback of limiting the active surface area of the integrated circuit chip that can be utilized for forming interconnections because only the perimeter of the active surface of the integrated circuit chip can be used.

It is an object of the present invention to provide a method of encapsulating and reinforcing the electrical interconnections of an integrated circuit chip assembly which allows the use of highly viscous encapsulating materials and eliminates the need to use different encapsulating materials for underfilling and overmolding. It is also an object of this invention to provide a method of encapsulating an integrated circuit chip assembly which enables simultaneous underfilling and overmolding without reducing the active interconnection area of the integrated circuit chip or substantially altering the substrate design. Another object of this invention is to provide an integrated circuit chip assembly having a reinforced electrical interconnection which is more resistant to weakening as a result of stress created by the differences in coefficient of thermal expansion between the integrated circuit chip and the substrate.

SUMMARY OF THE INVENTION

This invention provides an improved method for encapsulating the solder ball interconnections of an integrated circuit assembly which accommodates the use of high viscosity encapsulating materials and allows simultaneous underfilling and overmolding; and eliminates the need for a dam to contain flow. In accordance with the preferred embodiment of this invention, an integrated circuit chip assembly comprised of an integrated circuit chip mounted on a chip carrier or directly on a circuit board in a standoff relationship by solder ball connections is provided.

A mold is placed over the integrated circuit chip. The mold is constructed with an opening extending from the inside surface of the mold to the outside surface of the mold and at least one vent. External pressure is applied to the mold to seal the mold to the surface of the substrate to which the integrated circuit chip is attached. The mold is constructed so that there is a space between the inner surface of the mold and the integrated circuit chip. A metered volume of encapsulant material is dispensed through the opening into the space surrounding the integrated circuit chip and the space between the integrated circuit chip and the chip carrier or circuit board. The preferred encapsulant material comprises a high strength thermosetting one part epoxy containing about 50% to 80% by weight of inorganic electrically non-conductive filler and has a viscosity at 25° C. of about 250 Pascal-seconds measured using a Brookfield viscometer, model HBT, with a CP-52 cone head, at 2 rpm; although materials having viscosities in the range of about 10 to 1,000 Pascal-seconds may also be used.

After the required amount of encapsulant material is dispensed, the material is cured to form a bond between the integrated circuit chip and the chip carrier or circuit board and reinforce the solder ball connections.

DETAILED DESCRIPTION

Figure 1A:
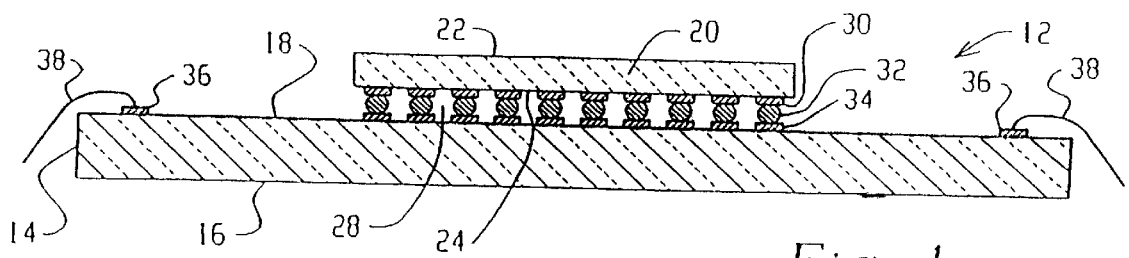
FIG. 1a is a longitudinal sectional view somewhat diagrammatic of an integrated circuit chip mounted on a chip carrier.

Referring to FIG. 1a, an integrated circuit chip assembly, indicated generally at 12, is comprised of a chip carrier 14, having a remote surface 16 and a mounting surface 18, and an integrated circuit chip 20, having a remote surface 22 and an attachment surface 24. The integrated circuit chip 20 is mounted on the chip carrier 14 in a standoff relationship with the attachment surface 24 of the integrated circuit chip 20 facing the mounting surface 18 of the chip carrier 14, defining a space 28 between the attachment surface 24 of integrated circuit chip 20 and the mounting surface 18 of the chip carrier 14. In a typical integrated circuit chip assembly, the height of the space 28 is about 0.002 to 0.006 inches. The attachment surface 24 of the integrated circuit chip 20 has arranged thereon, a plurality of electrical contacts 30. Each electrical contact 30 has a solder ball 32 attached thereto. The mounting surface 18 of the chip carrier 14 has arranged thereon, a plurality of electrical contacts 34, each of said electrical contacts 34 arranged to correspond to a solder ball 32 on the attachment surface 24 of the integrated circuit chip 20.

Figure 1B:
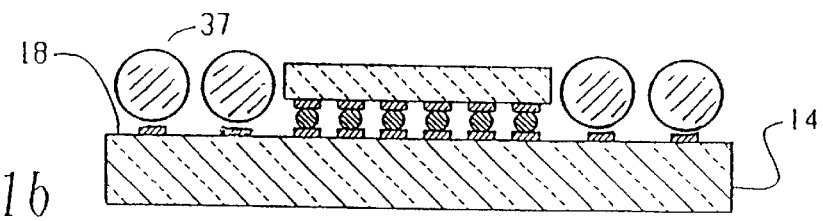
FIG 1b is a longitudinal sectional view somewhat diagrammatic of an integrated circuit chip mounted on a chip carrier of the ball grid array type.
Figure 1C:
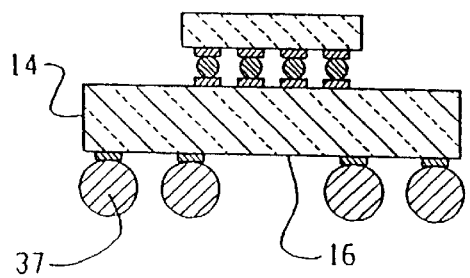
FIG 1c is a longitudinal sectional view somewhat diagrammatic of an integrated circuit chip mounted on a chip carrier of the ball grid array type.

The chip carrier 14 in one embodiment is comprised of a ceramic material, typically alumina having a coefficient of thermal expansion of about 6 ppm/° C. The chip carrier can also be comprised of organic materials such as PTFE, polyimides, polytetrafluoroethylene, epoxies, triazines, bismaleimides, bismaleimides/triazines, and blends of these materials. These materials may be reinforced with either woven or non-woven inorganic or organic media such as glass or organic fibers. Such organic materials typically have coefficients of thermal expansion ranging from about 6 to 50 ppm/° C. The chip carrier has arranged about its perimeter, a plurality of electrical contacts 36. Each electrical contact 36 has attached thereto a wire lead 38 for interconnection between the chip carrier 14 and a circuit board, to which the integrated circuit chip assembly is to be attached. The chip carrier 14 may also be of the ball grid array type as shown in FIGS. 1b and 1c, wherein rather than having edge leads, solder balls 37 having a diameter of about 0.020 to 0.030 inches are attached to the attachment surface 18 or the remote surface 16 of the chip carrier 14. The integrated circuit chip 20 is typically comprised of monocrystalline silicon having a coefficient of thermal expansion of about 2 to 4 ppm/° C. Each solder ball 32 is typically comprised of an electrically conductive metallic solder material. The integrated circuit chip 20 is attached to the chip carrier 14 by solder reflow. During operation, the chip carrier 14 and the integrated circuit chip 20 are subjected to repeated cycles of heating and cooling. Because the chip carrier 14 and the integrated circuit chip 20 have different coefficients of thermal expansion, they expand and contract at different rates. This results in thermal stress on the connections between the solder balls 32 and the electrical contacts 30 and 34, sometimes causing the interconnection between the chip carrier 14 and the integrated circuit chip 20 to weaken or even fracture.

Figure 2:
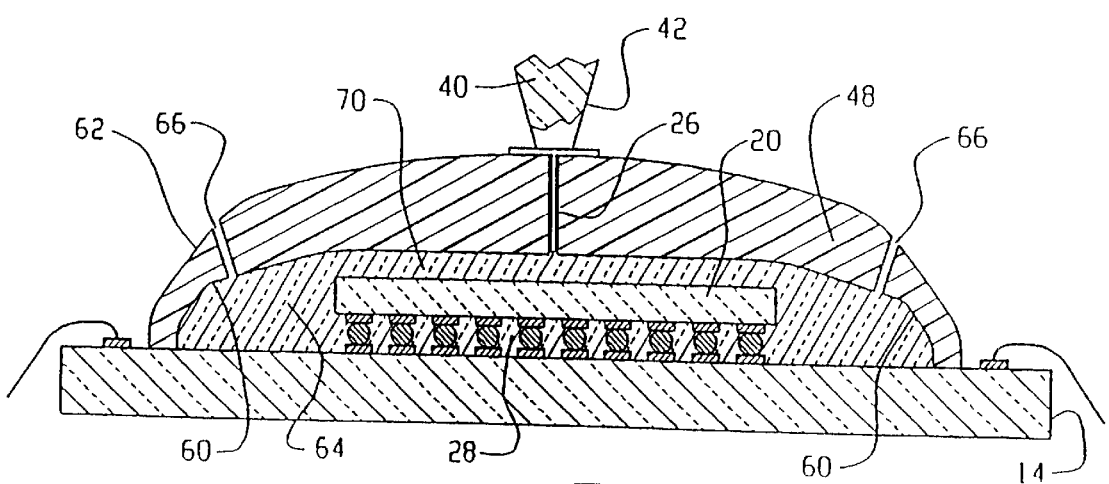
FIG. 2 is a longitudinal sectional view somewhat diagrammatic of an integrated circuit chip mounted on a substrate and covered by a mold ready to receive an encapsulant according to one embodiment of this invention.

Referring to FIG. 2, in which the several elements are similar to like elements of FIG. 1, a mold 58 having an inside surface 60 and an outside surface 62 is placed over the integrated circuit chip 20 so that there is a space 70 between the inside surface 60 of the mold 58 and the remote surface 22 of the integrated circuit chip 20, and a void 64 surrounding the integrated circuit chip 20. In a preferred embodiment, the mold 58 is comprised of metal or plastic. External pressure is applied to the outside surface 62 of the mold 58 to seal the mold 58 to the mounting surface 18 of the chip carrier 14. The mold 58 has at least one opening 26 extending from the inside surface 60 to the outside surface 62 and at least one vent 66. An amount of the encapsulant 40 necessary to substantially fill the space 70, the void 64 and the space 28 is dispensed through the opening 26. The encapsulant 40 is forced into the space 70 and into the void 64 and under the integrated circuit chip 20 into the space 28. In a preferred embodiment, the encapsulant 40 comprises Hysol FP-4323, a high strength thermosetting one part epoxy containing about 50–70% by weight of a ceramic filler and has a viscosity at 250° C. of about 250 Pascal-seconds measured using a Brookfield viscometer, model HBT, with a CP-52 cone head, at 2 rpm, although encapsulants having viscosities in the range of about 10 to 1,000 Pascal-seconds can be used. The encapsulant 40 is dispensed through the opening 26 using a dispensing apparatus indicated generally at 42. In the preferred embodiment, using an encapsulant 40 having a viscosity of about 250 Pascal-seconds at 250° C., the dispensing apparatus 42 comprises an injection apparatus with a 0.020 inch diameter needle. A pressure of approximately 80 psi is required to inject the encapsulant 40 into the void 64 and the space 28. The encapsulant 40 is heated for about 2 hours at 160° C. to cure the encapsulant 40 and form a bond between the integrated circuit chip 20 and the chip carrier 14 and reinforce the solder ball connections. The mold 58 can be removed prior to or after curing. This method may also be used to attach an integrated circuit chip directly to a circuit board.

Accordingly, the preferred embodiment of the present invention has been described. With the foregoing description in mind, however, it is understood that this description is made only by way of example, that the invention is not limited to the particular embodiments described herein, and that various rearrangements, modifications and substitutions may be implemented without departing from the true spirit of the invention as hereinafter claimed.

What is claimed is:

1. A method for encapsulating and reinforcing the electrical interconnections of an integrated circuit chip assembly, comprising the steps of:

providing a substrate having a remote surface and a mounting surface and an integrated circuit chip having an attachment surface and a remote surface; said attachment surface of said integrated circuit chip being attached to said mounting surface of said substrate in a standoff relationship thereby defining a space therebetween, said space having a height of about 0.002 to 0.006 inches;

placing a mold over said integrated circuit chip, said mold having at least one opening extending from an inner surface of said mold to an outer surface of said mold and at least one vent, said inner surface of said mold facing said remote surface of said integrated circuit chip in a standoff relationship, thereby defining a void;

applying pressure to said outer surface of said mold to seal said mold to said mounting surface of said substrate;

providing a volume of an encapsulant necessary to substantially fill said space and said void, said encapsulant comprising a thermosetting polymer having a viscosity in the range of about 10 to 1000 Pascal-seconds at dispense temperature;

dispensing said volume of said encapsulant through at least one of said openings into said space; and curing said encapsulant to form a bond between said substrate and said integrated circuit chip.

2. The method of claim 1 wherein said attachment surface of said integrated circuit chip is attached to said mounting surface of said substrate using a plurality of solder ball connections.

3. The method of claim 2 wherein said substrate comprises a chip carrier.

4. An integrated circuit chip assembly produced according to the method of claim 3.

5. The method of claim 2 wherein said substrate comprises a circuit board.

6. An integrated circuit chip assembly produced according to the method of claim 5.

7. An integrated circuit chip assembly produced according to the method of claim 2.

8. An integrated circuit chip assembly produced according to the method of claim 1.

9. The invention as defined in claim 1 wherein said encapsulant is an epoxy.

10. The invention as defined in claim 9 wherein said epoxy is a filled epoxy.

11. The invention defined in claim 10 wherein the epoxy is filled with ceramic.

12. The invention as defined in claim 1 wherein said substrate has electrical contacts on said mounting surface, and said integrated circuit chip is attached to said electrical contacts.

13. The invention as defined in claim 1 wherein said substrate is ceramic.

14. The invention as defined in claim 1 wherein said substrate is an organic material.

* * * * *